Figure 1:
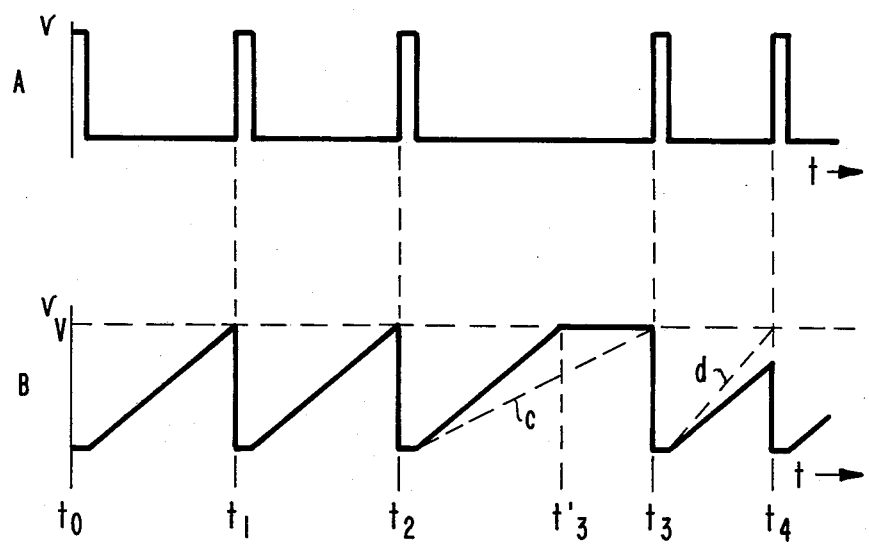

United States Patent [19]

Isham, II

[11] 4,071,776
[45] Jan. 31, 1978

[54] SAWTOOTH VOLTAGE GENERATOR FOR CONSTANT AMPLITUDE SAWTOOTH WAVEFORM FROM VARYING FREQUENCY CONTROL SIGNAL

[75] Inventor: Robert Haynes Isham, II, Piscataway, N.J.

[73] Assignee: RCA Corporation, New York, N.Y.

[21] Appl. No.: 715,852

[22] Filed: Aug. 19, 1976

[51] Int. Cl.² ............................................. H03K 4/08
[52] U.S. Cl. .................................. 307/228; 328/184; 328/185
[58] Field of Search ................ 307/228; 328/184, 185

[56] References Cited
U.S. PATENT DOCUMENTS

| | | | |
|---|---|---|---|
| 3,273,007 | 9/1966 | Schneider | 307/228 |
| 3,373,377 | 3/1968 | Townsend | 328/184 |
| 3,577,007 | 5/1971 | Cross | 307/228 |
| 3,577,012 | 5/1971 | Dummermuth | 307/228 |
| 3,619,649 | 11/1971 | Hoffman | 307/228 |
| 3,808,460 | 4/1974 | Mosca | 307/228 |

*Primary Examiner*—Stanley D. Miller, Jr.
*Attorney, Agent, or Firm*—H. Christoffersen; Allen LeRoy Limberg; Lawrence P. Benjamin

[57] ABSTRACT

A generator of recurrent ramp voltages in response to a pulse train. It includes a circuit for ensuring that the output voltage of the generator reaches its maximum value just prior to the occurrence of the next trigger pulse despite such perturbations as a change in the frequency of the pulse train, a change in the value of the circuit supply voltage, or changes in component values.

6 Claims, 6 Drawing Figures

SAWTOOTH VOLTAGE GENERATOR FOR CONSTANT AMPLITUDE SAWTOOTH WAVEFORM FROM VARYING FREQUENCY CONTROL SIGNAL

Sweep generating circuits which include a reactive element that is charged and discharged in response to a trigger pulse to produce a sawtooth voltage are well known in the art. It is sometimes difficult in such circuits to obtain an output voltage whose value reaches substantially the same voltage level at the end of each sweep period. This is especially true in circuits which must be mass produced, where it is not possible, as a practical matter, to pick and choose from among circuit components whose individual values may vary over some reasonable range. Other factors which may adversely affect performance include a variation in frequency of the trigger pulses or the value of the circuit supply voltage.

In the drawing, wherein corresponding elements have been given similar reference designations:

FIG. 1 is a drawing of waveforms to illustrate one of the problems discussed above and to help explain the operation of the circuits in the following FIGS.; and FIGS. 2 through 6 are schematic diagrams of various embodiments of the invention.

FIG. 1 illustrates, by way of example, how a variation in the trigger pulse frequency can affect the waveform produced by a sweep generator. Waveform A represents a pulse train used to initiate the sweep while waveform B represents the output of a typical sweep circuit. During the period that the pulse voltage is high, the reactive element is discharged. This time is known as the "flyback" or restoration time of the sweep. The sweep voltage begins to increase when the trigger voltage drops to its low value. The time interval $t_o - t_2$ represents desired interval (two periods) of operation of the sweep generator. The sweep voltages reaches the desired value V just prior to the occurrence of the next trigger pulse. During time interval $t_2 - t_3$, the instantaneous frequency of the trigger pulse has decreased. As a result, the sweep voltage reaches its maximum value at a time $t_3'$ well prior to the occurrence of the pulse at time $t_3$. During the interval $t_3 - t_4$, the instantaneous frequency of the trigger pulses has increased. As a result, the sweep voltage is reset at time $t_4$ before this voltage has reached the desired level of V volts.

Such departures from ideal operation as illustrated over intervals $t_3 - t_4$ may be undesirable in many applications where a sweep generator is used. For example, if the sweep voltage is used in conjunction with a video display, the electron beam will be deflected to and then remain at one edge of the screen for an interval $t_3' - t_3$ rather than flying back at the earlier time $t_3'$, as desired, or the beam will be deflected less than full scale (interval $t_3 - t_4$). Where the sweep generator is used as part of a phase sensitive switcing circuit, that is, where the sweep generator produces a voltage proportional to phase, the waveforms present over intervals $t_2 - t_4$ would cause errors in the system switching point. This is because each trigger pulse period represents 360 electrical degrees. It can be seen that the voltage corresponding to a given phase delay is different over intervals $t_1 - t_2$, $t_2 - t_3$, and $t_3 - t_4$, this voltage being in error over the latter two intervals.

A circuit according to one embodiment of the invention providing a solution to the problems discussed above is illustrated in FIG. 2. It includes PNP transistor 10 which is connected at its emitter electrode through resistor 12 to terminal 14 to which an operating voltage may be applied. Capacitor 16 is connected between terminal 14 and the base electrode of transistor 10. This electrode is also connected at node 17 through resistor 18 to terminal 20, which terminal is at a reference potential, herein ground. Connected to the collector electrode of transistor 10 are the collector electrode of NPN transistor 22, one terminal of capacitor 24 and output terminal 26. The emitter electrode of transistor 22 and the other terminal of capacitor 24 are connected to terminal 20. The base electrode of transistor 22 is connected at terminal 28 to trigger pulse source 30.

Figure 2:
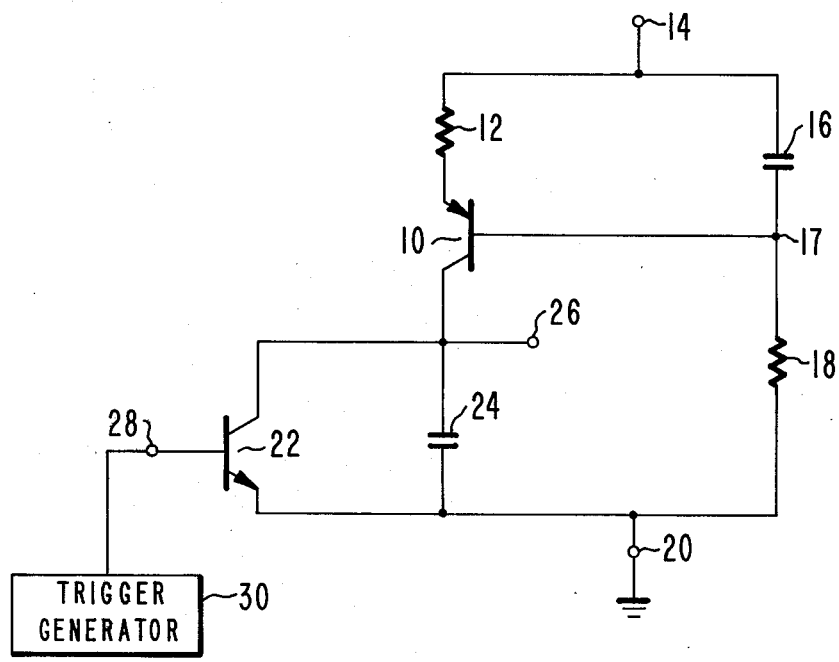

In the operation of the ramp generator circuit of FIG. 2, assume initially that the generator has been operating at a constant frequency for a sufficient number of cycles to have reached an equilibrium condition. Transistor 22 functions as a switch. When generator 30 applies a positive trigger pulse to the base of this device, it turns on. This discharges capacitor 24 through the collector-emitter path of transistor 22 to a voltage level equal to the saturation voltage of this transistor. This saturation voltage may be considered negligible compared to the peak magnitude of the sweep voltage and, for this reason, the voltage across the capacitor, when discharged, will be considered equal to zero in the following discussion. At the end of the trigger pulse, transistor 22 turns off and capacitor 24 begins to charge. The waveform of a typical trigger pulse train is shown at A of FIG. 1. The duty cycle of such pulses is generally very small, that is, its duration is only a small fraction of the period between pulses.

Capacitor 24 charges through a path comprising resistor 12 and the collector-emitter path of transistor 10. The capacitor is charged with current that is essentially constant. This current approximately equals the voltage across resistor 12 divided by the value of this resistance. As is well known in the art, such constant current charging of a capacitor produces a voltage across this capacitor that increases linearly with time. The charging rate for this circuit is chosen such that saturation of transistor 10 occurs just prior to the application of the next trigger pulse. The saturation of transistor 10 maximizes the peak amplitude of the sweep that may be obtained for a given value of supply voltage. This peak amplitude equals the value of the voltage at terminal 14 minus the voltage drop across resistor 12 minus the saturation voltage of transistor 10. The voltage across capacitor 24, which is the circuit output voltage, is shown in idealized form at B of FIG. 1 over interval $t_o - t_2$.

The circuit of FIG. 2 differs from the prior art (see U.S. Pat. No. 3,273,007 to Schneider) among other respects in the use of an unshunted capacitor 16, rather than a resistance ($R_B$ in Schneider). However, this difference in structure is most significant and results in a new mode of operation neither considered in nor obvious from the patented circuit. Assume that 16 is a resistor instead of a capacitor and that the voltage across capacitor 24 assumes the undesirable waveform shown over interval $t_2 - t_3$ at B of FIG. 1 for any of the reasons already discussed. In this event the output voltage would continue to have the shape of th sweep volage waveform shown at interval $t_2 - t_3$ of FIG. 1 for as long as the error was present.

In the circuit of the present application, this does not occur. Rather, after several periods of operation, that is several successive periods (not illustrated) in which the trigger pulses are spaced a period $t_2 - t_3$ apart, the ramp assumes the shape shown as dashed line "C" over the interval $t_2 - t_3$ of B of FIG. 1. If the waveform shown by the solid line in interval $t_2 - t_3$ occurs, it is indicative of a condition wherein the charging rate for capacitor 24 is too high. This rate must be reduced by reducing the charging current into capacitor 24, which in turn is set by the voltage across resistor 12. When the output voltage reaches its maximum value too early (time $t_3'$ of FIG. 1), transistor 10 is saturated over interval $t_3' - t_3$. This saturation interval is much longer than desired. As mentioned earlier, saturation should occur just prior to the application of the next trigger pulse. During saturation, the input impedance of transistor 10 drops from a relatively high to a relatively low value, thereby changing the ratio of the voltage divider formed by resistor 18 and the input impedance of transistor 10. During saturation, when the input impedance of transistor 10 decreases significantly, the voltage between the base electrode of 10 and terminal 14 tries to decrease. This voltage can decrease only if capacitor 16 discharges, which discharge occurs through a path comprising the input circuit of transistor 10 and resistor 12. The sum of the voltages across resistor 18 ($V_{18}$) and capacitor 16 ($V_{16}$) remains constant and is equal to the supply voltage $V_{14}$, that is, $V_{16} + V_{18} = V_{14}$. As capacitor 16 discharges, the potential at the base of transistor 10 rises towards the value of the supply voltage $V_{14}$. Since the voltage across resistor 12 equals the value of the base voltage minus the forward base-emitter voltage drop ($V_{BE}$) of transistor 10, the discharge of capacitor 16 causes the voltage across resistor 12 to decrease, as desired. This decrease tends to adjust the charging rate in the desired direction. Eventually, that is, after a number of successie periods (not illustrated) of duration $t_2 - t_3$, a new equilibrium condition is reached in the circuit as shown by dashed line "c", whereby transistor 10 once more saturates just prior to the next trigger pulse.

In a similar manner, the charging rate of capacitor 24 is increased when the sweep voltage does not reach the desired value. This condition is shown at interval $t_3 - t_4$ of FIG. 1, waveform B. The rate must be increased by increasing the voltage across the resistor 12. This automatically is accomplished in the circuit, in response to the base current flow during the interval $t_3 - t_4$, in the following manner. The value of resistor 18 is chosen such that it can sink an amount of current in excess of that supplied by the base circuit of transistor 10. The additional current demands of resistor 18 are satisfied by capacitor 16 which tends to increase the voltage across this latter element. The increase in voltage across the capacitor results in an increase in the voltage across resistor 12, as desired. After several successive short periods (not illustrated) such as $t_3 - t_4$, capacitor 16 eventually charges to a value where circuit equilibrium is reached with transistor 10 saturating at the desired time. The waveform at equilibrium is shown by dashed line "d" over interval $t_3 - t_4$ at B of FIG. 1.

It should be noted that, because the voltage across capacitor 16 changes in response to the above described circuit perturbations, the voltage across resistor 12 also changes. This means that the peak voltage to which capacitor 24 may charge also varies. However, where the voltage across resistor 12 is much less than the peak value of the sweep voltage (a reasonable assumption for most sweep applications), this peak may be considered to be substantially unaffected by the variations in voltages across capacitor 16.

For one embodiment of the invention, the value of resistor 18 is chosen to accept two to four times the minimum base current supplied by transistor 10 during the charging periods of capacitor 24. The time constant of the network comprising resistor 18 and capacitor 16 is chosen to be large compared to the desired ramp period. While this large time constant means that it may take several ramp periods for the circuit to adjust to a new equilibrium condition, such a time constant ensures that there is relatively little change in the voltage at the base of transistor 10 during the charging intervals for capacitor 24. As a result, the linearity of the ramp voltage is improved. In this embodiment, the following component values were used: for resistors 12 and 18, 6.8 Kilohm and 12 Megohm, respectively; for capacitors 24 and 16, 0.05μF and 10μF, respectively. A 12 volt supply was used, transistors 10 was a 2N3906 and transistor 22 was a 2N3904. The ramp frequency was 60Hz.

Figure 3:
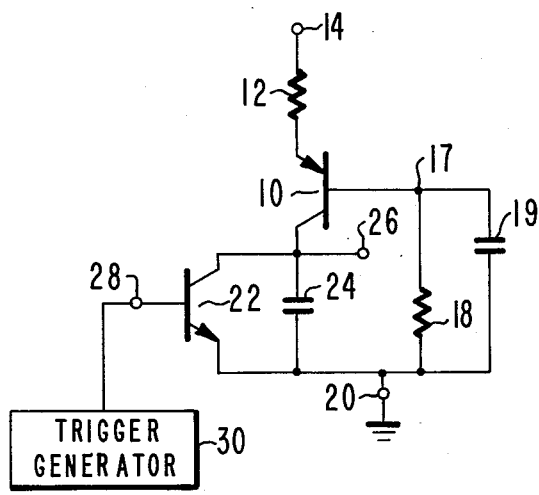

A second embodiment of the invention is shown in FIG. 3. In this FIGURE, capacitor 16 is removed from the circuit of FIG. 2 and capacitor 19 is connected between node 17 and the reference potential. All other connections are unchanged from the circuit of FIG. 2. Operation of this circuit is similar to the operation of the circuit of FIG. 2. The voltage at the base of transistor 10 is once more determined by the amount of charge stored by a capacitor, in this case capacitor 19, connected to this electrode. During periods of saturation of transistor 10, such as shown at interval $t_3' - t_3$ of FIG. 1, the excess base current of transistor 10 flows into capacitor 19. This causes the voltage at node 17 to increase, reducing the voltage across resistor 12, thereby decreasing the charging rate of capacitor 24.

During times when the peak value of the circuit output voltage does not rise to the maximum possible level, such as is shown over interval $t_3 - t_4$ in FIG. 1, the charging rate of capacitor 24 is increased in the following manner. The low charging rate means that the base circuit of transistor 10 cannot supply the current demanded by resistor 18. This additional current is supplied through capacitor 19, tending to discharge this latter component. As a result, the voltage at node 17 decreases, thereby increasing the voltage across resistor 12 and the available charging current.

While the circuits of FIGS. 2 and 3 offer similar solutions to the above described problems, the former circuit offers an additional advantage not present in the latter one. If there is a contaminating signal present in the voltage connected to terminal 14 due, for example, to line noise or ripple, the circuit of FIG. 2 minimizes the effects of such a signal on the charging current through resistor 12. Assume that the contaminating signal instantaneously causes the voltage at terminal 14 to increase. Since the voltage across a capacitor can't change instantaneously, this increase is coupled through capacitor 16 to the base of transistor 12. As a result, both ends of resistor 12 are elevated by the amount of this increase, thereby keeping the voltage across this element constant. This means that the charging current does not change in response to the contaminating signal, thus maintaining the linearity of the output voltage ramp. A similar contaminating signal in the circuit of FIG. 3 causes the voltage at terminal 14 to vary while capacitor 19 tends to maintain the voltage at the base of transistor 10 at a constant DC voltage level. As a result, the magnitude of the charging current varies in response to the contaminating signal. The circuit of FIG. 2 is therefore the recommended configuraton if the possibility of power supply noise exists.

Figure 4:
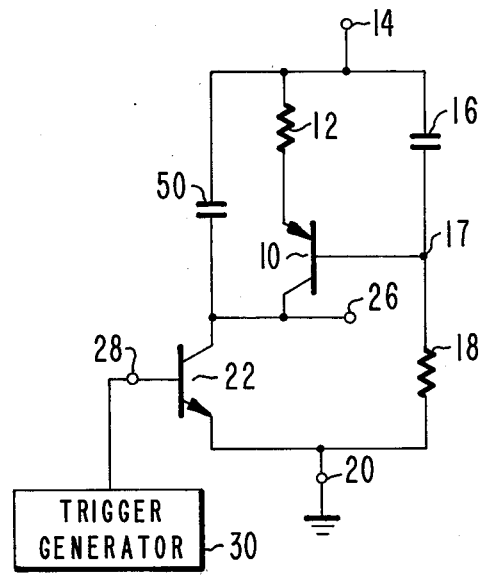

FIG. 4 is an embodiment of the invention where the discharge rate, rather than the charging rate, of an energy storage element may be varied. This circuit is a modification of the circuit of FIG. 2 wherein the capacitor 24 is removed from the latter circuit and replaced in FIG. 4 by a capacitor 50 connected between terminals 14 and 26.

In the operation of the circuit of FIG. 4, the amplitude of the voltage at terminal 26 drops to a value near the reference potential when transistor 22 conducts. This quickly charges capacitor 50 to a voltage essentially equal to the supply voltage value. When transistor 22 is turned off, capacitor 50 discharges through a path comprising resistor 12 and the collector-emitter path of transistor 10. The discharge rate is controlled by the resistance of element 12 and the voltage across this resistor. This constant current discharge causes the voltage at terminal 26 to rise towards the supply voltage at a substantially linear rate.

Figure 5:
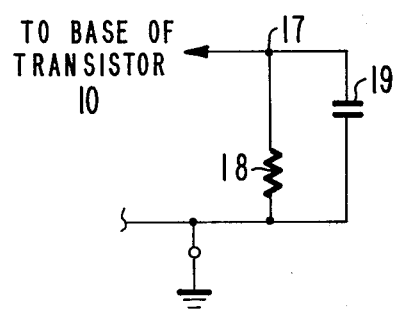

When the voltage across capacitor 50 decreases to a level whereby transistor 10 saturates, the discharge ceases. The voltage across capacitor 50 at this instant equals the voltage across resistor 12 plus the saturation voltage of transistor 10. Ideally, for the reasons discussed earlier, saturation is reached just prior to the occurrence of a trigger pulse. If the discharge rate of capacitor 50 is too slow or too fast, capacitor 16 adjusts the voltage across resistor 12 such that the desired discharge rate is achieved. The manner of achieving the desired discharge rate is similar to that described earlier in conjunction with the adjustment of the charging rate of capacitor 24 of FIGS. 2 and 3. The circuit of FIG. 4 may also be realized with capacitance 16 removed and capacitance 19 connected between the base of transistor 10 and the reference potential, as is shown in FIG. 5.

Figure 6:
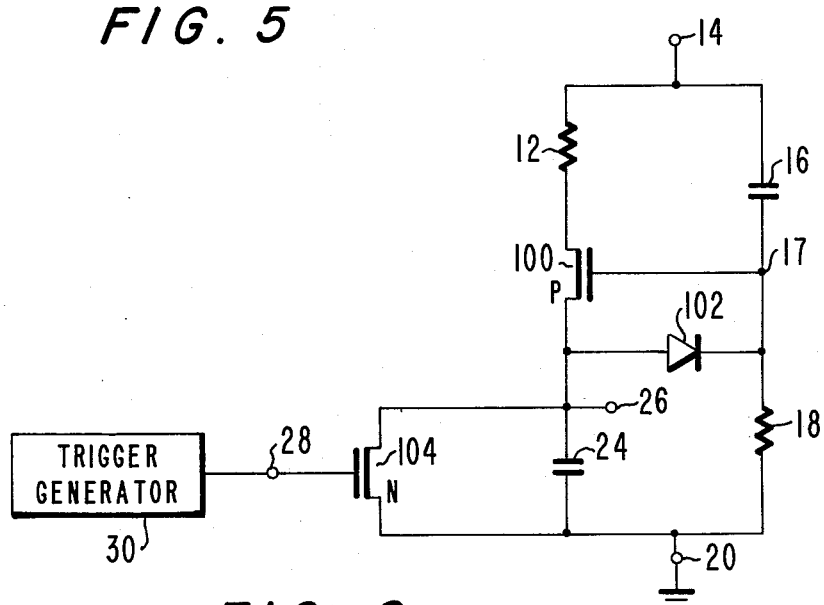

The circuit of FIG. 6 is an embodiment of the invention utilizing a conductor-insulator-semiconductor transistor such as a metal-oxide-semiconductor (MOS) transistor. The circuit of FIG. 6 modifies the circuit of FIG. 2 in the following manner. Transistor 10 is removed and replaced by P-type enhancement mode MOS transistor 100. The drain-source path of transistor 100 is connected between resistor 12 and capacitor 24. The gate or control electrode of transistor 100 is connected to node 17. Added to the circuit of FIG. 6 is semiconductor diode 102. The anode of this device is connected to terminal 26 while its cathode is connected to node 17. N-type MOS transistor 104 is utilized as a switching element in the circuit of FIG. 6 in place of the bipolar transistor 22 shown in the circuit of FIG. 2. The former circuit would, however, function in the desired manner if transistor 22 (or any other device having the desired switching characteristics) were used.

The operation of the circuit of FIG. 6 is analagous to that for the above described circuits. If the charging rate of capacitor 24 is too high, the voltage at terminal 26 rises to a value that forward biases diode 26. When this element conducts, a current path exists through resistor 12, diode 26 and capacitor 16. The direction of current flow through these elements tends to raise the potential at node 17 thereby reducing the voltage across capacitor 16. This reduces the voltage across resistor 12 which in turn reduces the charging rate of the capacitor.

If the charging rate of capacitor 24 is not high enough diode 102 will not conduct just prior to the occurrence of a reset pulse as desired. In this case, capacitor 16 will charge through resistor 18 thereby causing the voltage at node 17 to decrease. This decrease increases the voltage across capacitor 16 and, in turn, resistor 12 and continues until the voltage across resistor 12 increases to the desired value. It should be appreciated that the modifications to the circuit of FIG. 2 shown in FIGS. 3-5 may also be incorporated in the circuit of FIG. 6. Additionally, resistor 12 may be replaced with a short circuit in the circuit of FIG. 6 but if this is done, the charging current for capacitor 24 may not maintain the desired constant value.

The circuits of FIGS. 2 through 6 also compensate, in a manner similar to that described above, for changes in value of the supply voltage. While the peak value of the sawtooth wave varies in response to the supply voltage variations, these circuits ensure that this peak value has the maximum possible value and that this value is reached just prior to the occurrence of the next trigger pulse.

It should be appreciated that voltages having the opposite polarity to that shown or different initial and final values may be realized upon suitable choice of transistor conductivity types and supply voltage levels in the circuits of FIGS. 2 through 6 by using the teachings of the present application. Furthermore, the linearity of the output ramp may be improved by the substitutuion in the circuits of FIGS. 2-5 of an amplifier having a higher current gain in place of transistor 10. Such an amplifier may be realized through the use of a compound transistor configuration such as a Darlington connected pair.

What is claimed is:

1. A circuit for producing sawtooth voltage waves having substantially constant amplitude in response to a command signal whose frequency may vary comprising, in combination:

first and second voltage terminals across which an operating voltage may be applied;

an amplifier having input, output and common terminals;

first resistance means for coupling the first voltage terminal to the amplifier common terminal via a direct current conductivity path;

second resistance means connecting the amplifier input terminal to the second voltage terminal for providing effectively the sole direct current path to or from the amplifier input terminal;

a first energy storage element connected between the amplifier input terminal and one of the voltage terminals;

a second energy storage element connected between the amplifier output terminal and one of the voltage terminals; and switching means having a conduction path and a control electrode, said conduction path connected in parallel with the second energy storage element, the control electrode connected to a source of command signals the frequency of which varies.

2. The combination as set forth in claim 1 wherein said amplifier comprises a bipolar transistor having emitter, collector and base electrodes, the electrodes corresponding to the amplifier common, output and input terminals, respectively.

3. The combination as set forth in claim 1 wherein said amplifier comprises a metal-oxide-semiconductor transistor having source, drain and gate electrodes, the electrodes corresponding to the amplifier common, output and input terminals, respectively.

4. The combination as set forth in claim 3 further including diode means connected between the drain and gate terminals of said transistor.

5. The combination as set forth in claim 1 wherein said first and second energy storage elements comprise first and second capacitances, respectively.

6. The combination as set forth in claim 5 where the product of the component values of the first capacitance and first resistance means is large compared to the reciprocal of the frequency of the command signal applied to the control electrode of the switching means.

* * * * *